US009659967B2

(12) United States Patent
Kim

(10) Patent No.: US 9,659,967 B2
(45) Date of Patent: May 23, 2017

(54) THIN-FILM TRANSISTOR AND DISPLAY DEVICE HAVING THE SAME

(71) Applicant: Samsung Display Co., Ltd., Yongin, Gyeonggi-Do (KR)

(72) Inventor: Jae Sik Kim, Yongin (KR)

(73) Assignee: Samsung Display Co., Ltd., Yongin (KR)

( * ) Notice: Subject to any disclaimer, the term of this patent is extended or adjusted under 35 U.S.C. 154(b) by 181 days.

(21) Appl. No.: 14/020,695

(22) Filed: Sep. 6, 2013

(65) Prior Publication Data
US 2014/0203275 A1      Jul. 24, 2014

(51) Int. Cl.
*H01L 29/45*    (2006.01)
*H01L 27/12*    (2006.01)
*H01L 29/786*   (2006.01)

(52) U.S. Cl.
CPC .......... *H01L 27/1225* (2013.01); *H01L 29/45* (2013.01); *H01L 29/7869* (2013.01); *H01L 29/78606* (2013.01)

(58) Field of Classification Search
CPC ................ H01L 27/1225; H01L 29/45; H01L 29/78606; H01L 29/7869
See application file for complete search history.

(56) References Cited

U.S. PATENT DOCUMENTS

| 2008/0303020 A1* | 12/2008 | Shin ................ H01L 29/66742 257/43 |
| 2009/0315026 A1* | 12/2009 | Jeong ..................... H01L 29/45 257/43 |
| 2010/0159639 A1* | 6/2010 | Sakata ............. H01L 21/02565 438/104 |
| 2012/0217500 A1* | 8/2012 | Park ....................... H01L 29/45 257/59 |

FOREIGN PATENT DOCUMENTS

| KR | 10-2002-0044824 A | 6/2002 |
| KR | 10-2007-0014266 A | 2/2007 |
| KR | 10-2010-0082941 A | 7/2010 |

\* cited by examiner

*Primary Examiner* — Whitney T Moore
*Assistant Examiner* — Joseph Galvin, III
(74) *Attorney, Agent, or Firm* — Knobbe Martens Olson & Bear LLP

(57) ABSTRACT

A thin-film transistor includes a substrate, a gate electrode formed over the substrate, a gate insulating layer formed over the gate electrode and the substrate, an oxide semiconductor layer formed over the gate insulating layer and comprising a source section and a drain section, a first electrode formed over the substrate and electrically connected to the source section, and a second electrode formed over the substrate and electrically connected to the drain section. The thin-film transistor further includes a first barrier layer disposed between the oxide semiconductor layer and the first electrode, a second barrier layer disposed between the first barrier layer and the first electrode, and the first electrode being electrically connected to the oxide semiconductor layer via the first barrier layer and the second barrier layer.

20 Claims, 6 Drawing Sheets

THIN-FILM TRANSISTOR AND DISPLAY DEVICE HAVING THE SAME

This application claims priority from Korean Patent Application No. 10-2013-0006572 filed on Jan. 21, 2013 in the Korean Intellectual Property Office, the disclosure of which is incorporated herein by reference in its entirety.

BACKGROUND

1. Field

The present disclosure relates to a thin-film transistor and a display device having the same, and more particularly, to a thin-film transistor including an oxide semiconductor and a display device having the thin-film transistor.

2. Discussion of the Related Technology

A thin-film transistor includes a semiconductor layer which provides a channel region, a source region and a drain region, a gate electrode which overlaps the channel region and is insulated from the semiconductor layer by a gate insulating layer, and a source electrode and a drain electrode which are connected to the source region and the drain region of the semiconductor layer.

The thin-film transistor structured as described above is applicable not only to semiconductor integrated circuits but also to display devices such as liquid crystal displays (LCDs) and active matrix organic light-emitting diode (AMOLED) displays.

An increase in the resolution and size of a display device leads to a reduction in wiring width and an increase in wiring length, thus causing a sharp increase in wiring resistance. As the wiring resistance increases, an electric current or voltage applied to pixels becomes non-uniform due to a voltage drop (IR drop). This results in a defect or a reduction in image quality. Therefore, wirings such as electrodes of a thin-film transistor, scan lines and data lines are mostly formed of copper (Cu) with low resistivity.

However, if Cu is used for the wirings, device characteristics may deteriorate due to diffusion of the Cu.

Therefore, a thin-film transistor structured to prevent or block diffusion of Cu and ensure superior device characteristics needs to be researched.

SUMMARY

Aspects of the present invention provide a thin-film transistor which can prevent, or reduce diffusion of copper (Cu).

Aspects of the present invention also provide a display device having the thin-film transistor and superior characteristics.

However, aspects of the present invention are not restricted to the one set forth herein. The above and other aspects of the present invention will become more apparent to one of ordinary skill in the art to which the present invention pertains by referencing the detailed description of the present invention given below.

An aspect of the present invention provides a thin-film transistor comprising: a substrate which comprises a major surface, a gate electrode formed over the substrate, a gate insulating layer formed over the gate electrode and the substrate, an oxide semiconductor layer formed over the gate insulating layer and comprising a source section and a drain section, wherein at least a portion of the oxide semiconductor layer overlaps the gate electrode when viewed in a direction perpendicular to the major surface, a first electrode formed over the substrate and electrically connected to the source section, a second electrode formed over the substrate and electrically connected to the drain section, a first barrier layer disposed between the oxide semiconductor layer and the first electrode, a second barrier layer disposed between the first barrier layer and the first electrode, and the first electrode being electrically connected to the oxide semiconductor layer via the first barrier layer and the second barrier layer.

Another aspect of the present invention provides a thin-film transistor comprising: a substrate comprising a major surface, a gate electrode formed over the substrate, a gate insulating layer formed over the gate electrode and the substrate, an oxide semiconductor layer formed over the gate insulating layer and comprising a source section and a drain section, wherein at least a portion of the oxide semiconductor layer overlaps the gate electrode when viewed in a direction perpendicular to the major surface, a first electrode formed over the substrate and electrically connected to the source section, a second electrode formed over the substrate and electrically connected to the drain section, a transparent barrier layer disposed between the oxide semiconductor layer and the first electrode, and the first electrode being electrically connected to the oxide semiconductor layer via the transparent barrier layer.

A further aspect of the present invention provides a display device comprising: the foregoing thin-film transistor, a patterned planarization layer formed over the thin-film transistor, a first pixel electrode formed over the patterned planarization layer in each pixel, a pixel defining layer formed over the planarization layer and the first pixel electrode in a region corresponding to the thin-film transistor, a light-emitting layer formed over the first pixel electrode, and a second pixel electrode formed over the light-emitting layer.

BRIEF DESCRIPTION OF THE DRAWINGS

The above and other aspects and features of the present invention will become more apparent by describing in detail exemplary embodiments thereof with reference to the attached drawings, in which.

DETAILED DESCRIPTION OF EMBODIMENTS

Figure 1:
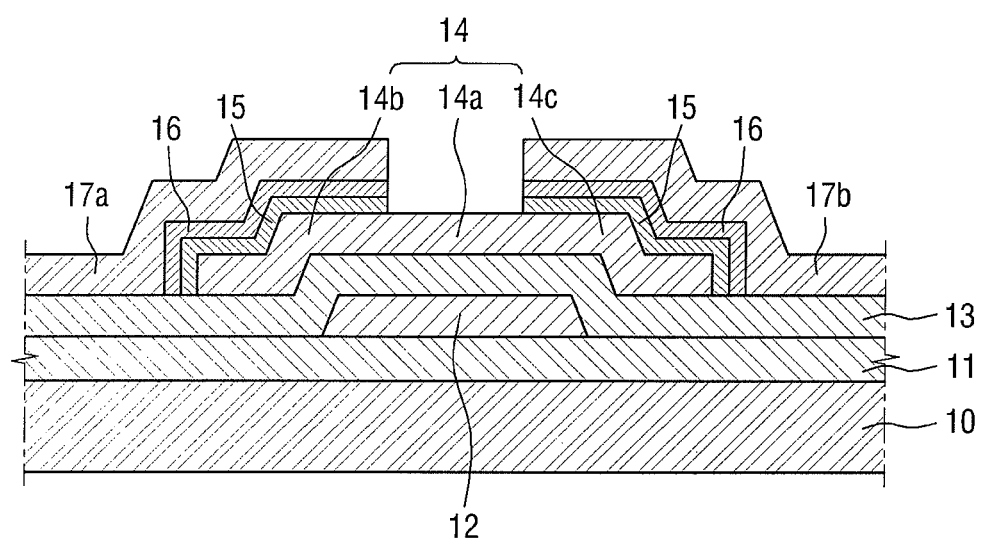
FIG. 1 is a schematic cross-sectional view of a thin-film transistor according to an embodiment of the present invention.

The aspects and features of the present invention and methods for achieving the aspects and features will be apparent by referring to the embodiments to be described in detail with reference to the accompanying drawings. However, the present invention is not limited to the embodiments disclosed hereinafter, but can be implemented in diverse forms. The matters defined in the description, such as the detailed construction and elements, are nothing but specific details provided to assist those of ordinary skill in the art in a comprehensive understanding of the invention, and the present invention is only defined within the scope of the appended claims.

The term "on" that is used to designate that an element is on another element or located on a different layer or a layer includes both a case where an element is located directly on another element or a layer and a case where an element is located on another element via another layer or still another element. In the entire description of the present application, the same drawing reference numerals are used for the same elements across various figures.

Although the terms "first, second, and so forth" are used to describe diverse constituent elements, such constituent elements are not limited by the terms. The terms are used only to discriminate a constituent element from other constituent elements. Accordingly, in the following description, a first constituent element may be a second constituent element.

Embodiments of the present invention will hereinafter be described with reference to the attached drawings.

Figure 2:
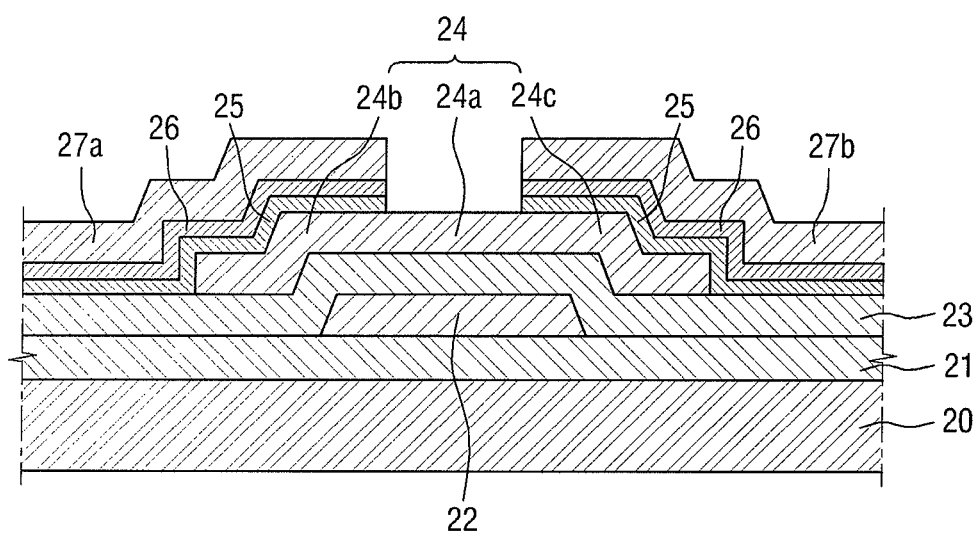
FIG. 2 is a schematic cross-sectional view of a modified example of the thin-film transistor of FIG. 1.

FIGS. 1 and 2 are cross-sectional views of thin-film transistors according to embodiments of the present invention.

Referring to FIG. 1, the thin-film transistor includes a buffer layer 11 formed on a substrate 10 and a gate electrode 12 formed on the buffer layer 11. A gate insulating layer 13 is formed on the gate electrode 12 and the buffer layer 11, and an oxide semiconductor layer 14 is formed on the gate insulating layer 13 and the gate electrode 12. The oxide semiconductor layer 14 is an active layer which provides a channel region 14a, a source region 14b, and a drain region 14c. A first barrier layer 15 is formed on each of the source region 14b and the drain region 14c of the oxide semiconductor layer 14, and a second barrier layer 16 is formed on the first barrier layer 15. A source electrode 17a is formed to be electrically connected to the source region 14b via the first barrier layer 15 and the second barrier layer 16. A drain electrode 17b is formed to be electrically connected to the drain region 14c via the first barrier layer 15 and the second barrier layer 16.

The substrate 10 may be a semiconductor substrate formed of silicon (Si), an insulating substrate formed of glass or plastic, or a metal substrate. The gate electrode 12 may be formed of any material having conductivity, in particular, a metal such as, but not limited to, Al, Cr or MoW.

The gate insulating layer 13 may be formed of any electrically insulating material. For example, the gate insulating layer 13 may be formed of an insulating material such as, but not limited to, $SiO_2$, $SiN_x$, $Ga_2O_3$, etc.

The oxide semiconductor layer 14 includes zinc oxide (ZnO) and may be doped with one or more ions selected from the group consisting of gallium (Ga), indium (In), stannum (Sn), zirconium (Zr), hafnium (Hf), cadmium (Cd), silver (Ag), copper (Cu), germanium (Ge), gadolinium (Gd), titanium (Ti), and vanadium (V). The oxide semiconductor layer 14 may be formed of, but not limited to, ZnO, ZnGaO, ZnInO, ZnSnO, GaInZnO, CdO, InO, GaO, SnO, AgO, CuO, GeO, GdO, HfO, TiZnO, InGaZnO, and InTiZnO.

The source electrode 17a and the drain electrode 17b may be formed of Cu with low resistivity. To prevent or block diffusion of Cu from the source electrode toward the oxide semiconductor layer 14, the first barrier layer 15 and the second barrier layer 16 are formed between the source electrode 17a and the oxide semiconductor layer 14. Further, to prevent or block diffusion of Cu from the drain electrode toward the oxide semiconductor layer 14, the first barrier layer 15 and the second barrier layer 16 are formed between the drain electrode 17b and the oxide semiconductor layer 14.

The second barrier layer 16 is formed of a material that can prevent or block diffusion of Cu, for example, Ti. The first barrier layer 15 may be formed of aluminum oxide ($AlO_x$) in order to prevent the second barrier layer 16 from contacting the oxide semiconductor layer 14 (i.e., the active layer) and thus being oxidized by the oxide semiconductor layer 14. In an example, Ti may be used for the second barrier layer 16, and the first barrier layer 15 may be omitted, that is, the oxide semiconductor layer 14 and the second barrier layer 16 may directly contact each other. In this example, however, Ti at the interface between the second barrier layer 16 and the oxide semiconductor layer 14 may be oxidized to $TiO_x$, which may deteriorate characteristics of the device.

The thicker the first barrier layer 15, the better the ability of the first barrier layer 15 to block the diffusion of Cu. However, an increase in the thickness of the first barrier layer 15 may lead to an increase in the size of the device and degradation of electrical characteristics of the device. Therefore, the first barrier layer 15 may be deposited to a thickness of about 500 Å or less. In addition, the first barrier layer 15 may be deposited to a thickness of about 50 Å or more in order to have a substantial level of blocking ability. That is, the thickness of the first barrier layer 15 may be in a range of about 50 Å to about 500 Å.

As described above, in the thin-film transistor of FIG. 1, the oxide semiconductor layer 14 is formed as the active layer, the source electrode 17a and the drain electrode 17b are formed of Cu, and the first barrier layer 15 formed of $AlO_x$ and the second barrier layer 16 formed of Ti are interposed between the oxide semiconductor layer 14 and each of the source electrode 17a and the drain electrode 17b.

In the thin-film transistor structured as described above, the second barrier layer 16 reduces the contact resistance between each of the source electrode 17a and the drain electrode 17b and the first barrier layer 15 and the resistance between each of the source electrode 17a and the drain electrode 17b and the oxide semiconductor layer 14.

The second barrier layer 16 blocks the diffusion of Cu from the source electrode to the oxide semiconductor layer and enables the source electrode 17a to form a stable bond with the first barrier layer 15. The second barrier layer 16 blocks the diffusion of Cu from the drain electrode to the oxide semiconductor layer and enables the drain electrode 17b to form a stable bond with the first barrier layer 15. In an example, Ti that forms the second barrier layer 16 forms a superior interfacial bond with Cu and $AlO_x$. Therefore, Ti can form a stable interfacial bond with the source and drain electrodes 17a and 17b and can form a stable interfacial bond with the first barrier layer 15. Thus, Ti enables each of the source and drain electrodes 17a and 17b to form a stable bond with the first barrier layer 15. Ti also serves as a trap to block the diffusion of Cu, and the addition of the first barrier layer 15 makes it possible to effectively block the diffusion of Cu to the oxide semiconductor layer 14.

Since current-voltage characteristics are improved by using Cu wirings with low resistivity while characteristics of the oxide semiconductor layer 14 are prevented from being degraded by the diffusion of Cu and the formation of titanium oxide, a thin-film transistor with improved electrical characteristics can be realized.

In FIG. 1, the first barrier layer 15 and the second barrier layer 16 are formed only on each of the source region 14b and the drain region 14c of the oxide semiconductor layer 14. In FIG. 2, a first barrier layer 25 and a second barrier layer 26 overlap the entire bottom surface of a source electrode 27a. Similarly, a first barrier layer 25 and a second barrier layer 26 overlap the entire bottom surface of a drain electrode 27b. In the structure of the thin-film transistor of FIG. 2, the first and second barrier layers 25 and 26 and the source and drain electrodes 27a and 27b can be patterned using one mask. Therefore, the number of masks and processes can be reduced compared with the structure of FIG. 1.

Except for the above difference in structure between the thin-film transistors of FIGS. 1 and 2, elements of the thin-film transistor of FIG. 2 are identical to those of the thin-film transistor of FIG. 1, and thus a repetitive description thereof will be omitted.

Figure 3:
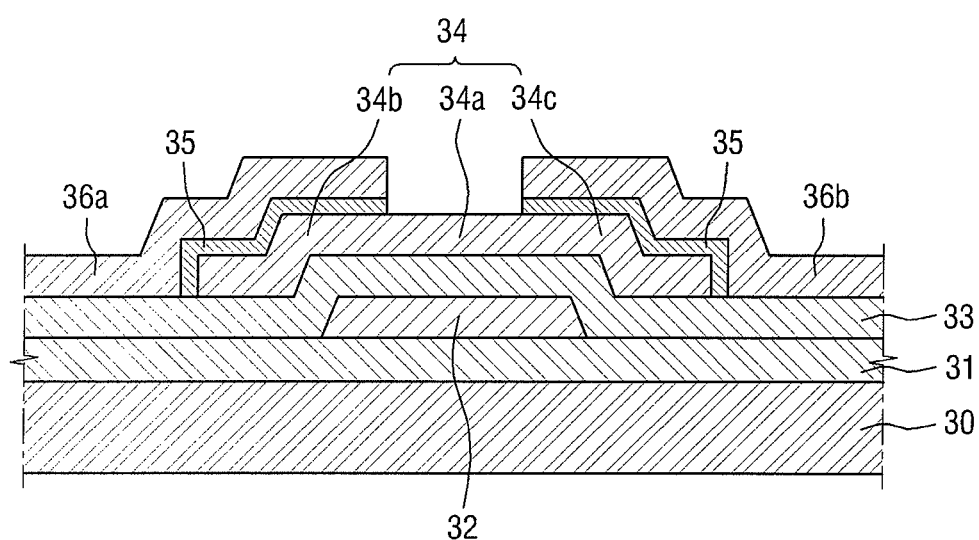
FIG. 3 is a schematic cross-sectional view of a thin-film transistor according to another embodiment of the present invention.
Figure 4:
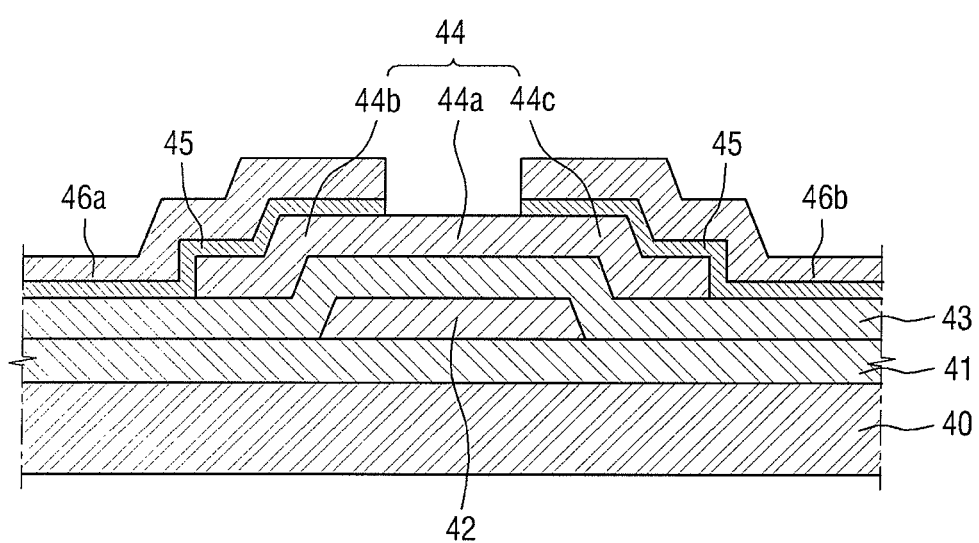
FIG. 4 is a schematic cross-sectional view of a modified example of the thin-film transistor of FIG. 3.

FIGS. 3 and 4 are cross-sectional views of thin-film transistors according to other embodiments of the present invention.

Referring to FIG. 3, the thin-film transistor includes a buffer layer 31 formed on a substrate 30 and a gate electrode 32 formed on the buffer layer 31. A gate insulating layer 33 is formed on the gate electrode 32 and the buffer layer 31, and an oxide semiconductor layer 34 is formed on the gate insulating layer 33 and the gate electrode 32. The oxide semiconductor layer 34 is an active layer which provides a channel region 34a, a source region 34b, and a drain region 34c. A transparent barrier layer 35 is formed on each of the source region 34b and the drain region 34c of the oxide semiconductor layer 34. A source electrode 36a is formed to be electrically connected to the source region 34b via the transparent barrier layer 35. Further, a drain electrode 36b is formed to be electrically connected to the drain region 34c via a transparent barrier layer 35.

The substrate 30, the buffer layer 31, the gate electrode 32, the gate insulating layer 33, the oxide semiconductor layer 34, the source electrode 36a and the drain electrode 36b of the thin-film transistor of FIG. 3 are identical to those of the thin-film transistor of FIG. 1, and thus a description thereof will be omitted.

To prevent or block diffusion of Cu from the source electrode toward the oxide semiconductor layer 34, the transparent barrier layer 35 is formed between the source electrode 36a and the oxide semiconductor layer 34. To prevent or block diffusion of Cu from the drain electrode toward the oxide semiconductor layer 34, the transparent barrier layer 35 is formed between the drain electrode 36b and the oxide semiconductor layer 34. The transparent barrier layer 35 may be formed of a material that can prevent or block the diffusion of Cu and forms a stable interfacial bond with each of the source electrode 36a and the drain electrode 36b and the oxide semiconductor layer 34. Examples of the material include, but not limited to IZO, GZO, and CuMn.

The thicker the transparent barrier layer 35, the better the ability of the transparent barrier layer 35 to block the diffusion of Cu. However, an increase in the thickness of the first barrier layer 15 may lead to an increase in the size of the device and degradation of electrical characteristics of the device. Therefore, the transparent barrier layer 35 may be deposited to a thickness of about 500 Å or less. In addition, the transparent barrier layer 35 may be deposited to a thickness of about 50 Å or more in order to have a substantial level of blocking ability. That is, the thickness of the transparent barrier layer 35 may be in a range of about 50 to about 500 Å.

As described above, in the thin-film transistor of FIG. 3, the oxide semiconductor layer 34 is formed as the active layer, the source electrode 36a and the drain electrode 36b are formed of Cu, and the transparent barrier layer 35 formed of $AlO_x$ is interposed between the oxide semiconductor layer 34 and the source electrode 36a and the drain electrode 36b.

In the thin-film transistor structured as described above, the transparent barrier layer 35 reduces the contact resistance between each of the source electrode 36a and the drain electrode 36b and the oxide semiconductor layer 34.

The transparent barrier layer 35 blocks the diffusion of Cu and enables each of the source electrode 36a and the drain electrode 36b to form a stable bond with the oxide semiconductor layer 34.

Since current-voltage characteristics are improved by using Cu wirings with low resistivity while characteristics of the oxide semiconductor layer 34 are prevented from being degraded by the diffusion of Cu, a thin-film transistor with improved electrical characteristics can be realized.

In FIG. 3, the transparent barrier layer 35 is formed only on each of the source region 34b and the drain region 34c of the oxide semiconductor layer 34. In FIG. 4, a transparent barrier layer 45 overlaps the entire bottom surface of a source electrode 46a. Similarly, a transparent barrier layer 45 overlaps the entire bottom surface of a drain electrode 46b. In the structure of the thin-film transistor of FIG. 4, the transparent barrier layers 45 and the source and drain electrodes 46a and 46b can be patterned using one mask. Therefore, the number of masks and processes can be reduced compared with the structure of FIG. 3.

Except for the above difference in structure between the thin-film transistors of FIGS. 3 and 4, elements of the thin-film transistor of FIG. 4 are identical those of the thin-film transistor of FIG. 3, and thus a repetitive description thereof will be omitted.

The thin-film transistors according to embodiments of the present invention can be applied to semiconductor integrated circuits, liquid crystal displays (LCDs), active matrix organic light-emitting diode (AMOLED) displays, etc.

Figure 5:
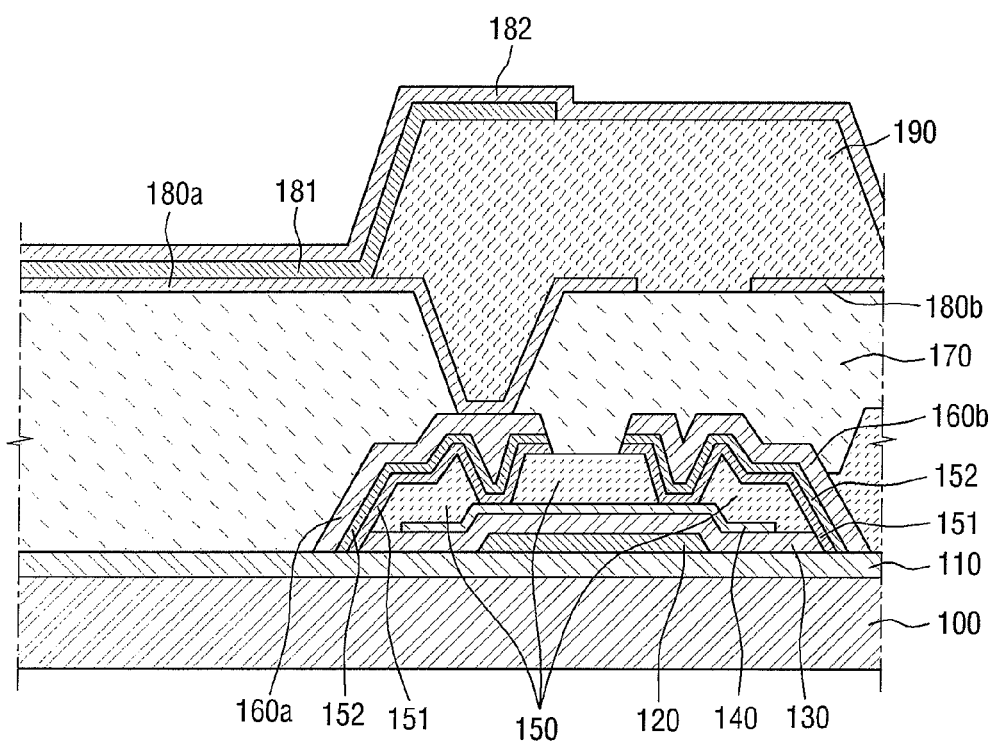
FIG. 5 is a schematic cross-sectional view of an active matrix organic light-emitting diode (AMOLED) display device according to an embodiment of the present invention.

FIG. 5 is a schematic cross-sectional view of an AMO-LED display device according to an embodiment of the present invention. Referring to FIG. 5, the AMOLED display device includes a buffer layer 110 formed on a substrate 100, and a gate electrode 120 formed on the buffer layer 110. A gate insulating layer 130 is formed on the gate electrode 120 and the buffer layer 110, and an oxide semiconductor layer 140 (i.e., an active layer) is formed on the gate insulating layer 130 and the gate electrode 120. A patterned etch stop layer 150 is formed on the oxide semiconductor layer 140. A first barrier layer 151 is formed on the patterned etch stop layer 150 and an exposed portion of each of the source and drain regions of the oxide semiconductor layer 140, and a second barrier layer 152 is formed on the first barrier layer 151. A source electrode 160b is formed to be electrically connected to the oxide semiconductor layer 140 via the first barrier layer 151 and the second barrier layer 152. Further, a drain electrode 160a is formed to be electrically connected to the oxide semiconductor layer 140 via the first barrier layer 151 and the second barrier layer 152. As a result, a thin-film transistor is completed. A patterned planarization layer 170 is formed on the thin-film transistor and the substrate 100. In each pixel, a first pixel electrode 180a or 180b is formed on the patterned planarization layer 170 and a portion of the drain electrode 160a exposed by the pattern of the planarization layer 170. A pixel defining layer 190 is formed on the planarization layer 170 and the first pixel electrode 180a or 180b in a region corresponding to the thin-film transistor. An organic light-emitting layer 181 is formed on the first pixel electrode 180a, and a second pixel electrode 182 is formed on the organic light-emitting layer 181.

The etch stop layer 150 is formed to protect the oxide semiconductor layer 140 in an etching process. The etch stop layer 150 may include through holes that partially expose the oxide semiconductor layer 140, so that the source electrode 160b and the drain electrode 160a can be electrically connected to the oxide semiconductor layer 140.

The planarization layer 170 covers the thin-film transistor completely and is formed in a pattern that enables the first pixel electrode 180a to be electrically connected to the drain electrode 160a.

The first pixel electrode 180a or 180b is formed on the planarization layer 170 in each pixel region defined by the pixel defining layer 190. The first pixel electrode 180a or 180b may be formed of any material that has conductivity and can be used as an electrode. Depending on the direction in which light is emitted, the first pixel electrode 180a or 180b may be formed of a transparent material or a reflective material.

The pixel defining layer 190 is a non-emission portion and defines each pixel region which is an emission region. The pixel defining layer 190 may be formed of a material that does not transmit light and may have a multilayer structure including layers of the material. Therefore, the pixel defining layer 190 may be formed in the region corresponding to the thin-film transistor.

The organic light-emitting layer 181 is formed between the first pixel electrode 180a or 180b and the second pixel electrode 182 in each pixel region defined by the pixel defining layer 190. The organic light-emitting layer 181 includes a stack (not shown) of a hole injection layer, a hole transport layer, an emitting layer, an electron transport layer, and an electron injection layer. The organic light-emitting layer 181 may include one or more stacks. The emitting layer in the stack may emit light of a color of a certain wavelength or may emit white light. To emit light of colors other than white, the emitting layer may be formed of a combination of colors that can produce a white color when mixed with each other. In one example, to emit white light, a color filter may be provided in the emission direction of light.

The second pixel electrode 182 is formed on the organic light-emitting layer 181. The second pixel electrode 182 may be formed over the pixel regions and the pixel defining layer 190. Like the first pixel electrode 180a or 180b, the second pixel electrode 182 may be formed of any material that has conductivity and can be used as an electrode. Depending on the direction in which light is emitted, the second pixel electrode 182 may be formed of a transparent material or a reflective material.

Figure 6:
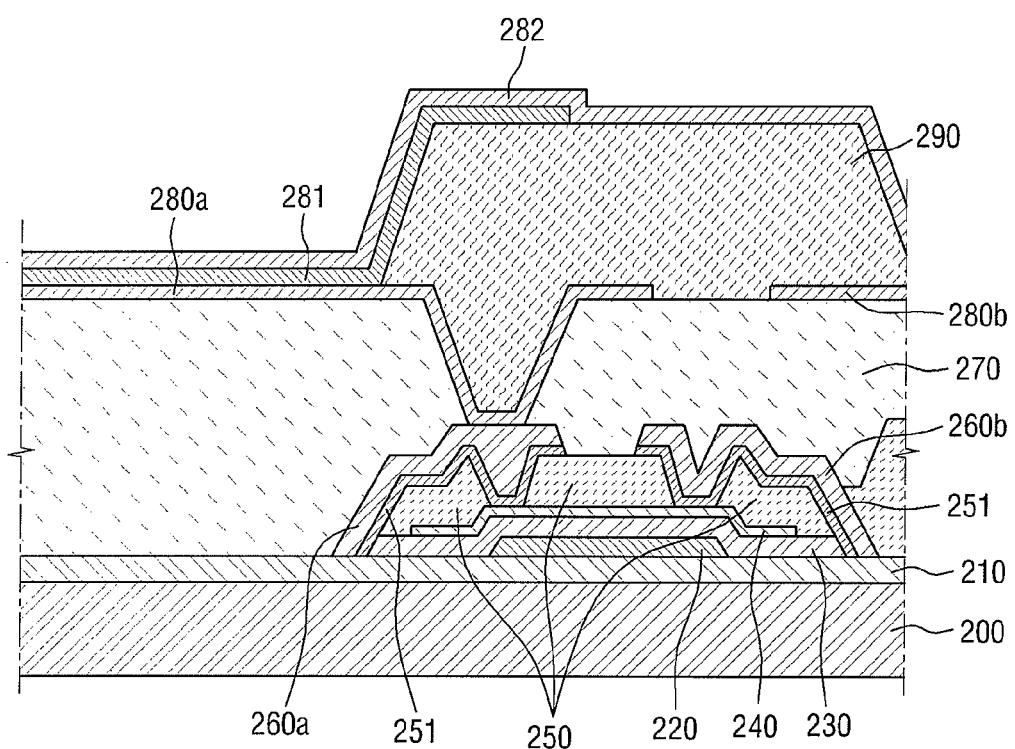
FIG. 6 is a schematic cross-sectional view of an AMOLED display device according to another embodiment of the present invention.

FIG. 6 is a schematic cross-sectional view of an AMOLED display device according to another embodiment of the present invention. Referring to FIG. 6, the AMOLED display device includes a buffer layer 210 formed on a substrate 200, and a gate electrode 220 formed on the buffer layer 210. A gate insulating layer 230 is formed on the gate electrode 220 and the buffer layer 210, and an oxide semiconductor layer 240 (i.e., an active layer) is formed on the gate insulating layer 230 and the gate electrode 220. A patterned etch stop layer 250 is formed on the oxide semiconductor layer 240, and a transparent barrier layer 251 is formed on the patterned etch stop layer 250 and an exposed portion of each of the source and drain regions of the oxide semiconductor layer 240. A source electrode 260b is formed to be electrically connected to the oxide semiconductor layer 240 via the transparent barrier layer 251. Further, a drain electrode 260a is formed to be electrically connected to the oxide semiconductor layer 240 via the transparent barrier layer 251. As a result, a thin-film transistor is completed. A patterned planarization layer 270 is formed on the thin-film transistor and the substrate 200. In each pixel, a first pixel electrode 280a or 280b is formed on the patterned planarization layer 270 and a portion of the drain electrode 260a exposed by the pattern of the planarization layer 270. A pixel defining layer 290 is formed on the planarization layer 270 and the first pixel electrode 280a or 280b in a region corresponding to the thin-film transistor. An organic light-emitting layer 281 is formed on the first pixel electrode 280a, and a second pixel electrode 282 is formed on the organic light-emitting layer 281.

The AMOLED display device of FIG. 6 is identical to the AMOLED display device of FIG. 5 except that the thin-film transistor uses the transparent barrier layer 251 instead of the first barrier layer 151 and the second barrier layer 152, and thus a repetitive description thereof will be omitted.

Although embodiments of the present invention have been described for illustrative purposes, those skilled in the art will appreciate that various modifications, additions and substitutions are possible, without departing from the scope and spirit of the invention as disclosed in the accompanying claims.

Embodiments of the present invention provide at least one of the following advantages.

That is, wirings such as source and drain electrodes of a thin-film transistor are formed of Cu with low resistivity, and diffusion of the Cu is blocked. Therefore, a reduction in electrical characteristics of the thin-film transistor can be prevented or minimized, and current-voltage characteristics of the thin-film transistor can be improved by the low resistivity of the Cu. In addition, a display device including the thin-film transistor can have high image quality and a large size.

What is claimed is:
1. A thin-film transistor comprising:
 a substrate comprising a major surface;
 a gate electrode formed over the substrate;
 a gate insulating layer formed over the gate electrode and the substrate;
 an oxide semiconductor layer formed over the gate insulating layer and comprising a source section and a drain section, wherein at least a portion of the oxide semiconductor layer overlaps the gate electrode when viewed in a direction perpendicular to the major surface;
 a first electrode formed over the substrate and electrically connected to one of the source and drain sections;
 a second electrode formed over the substrate and electrically connected to the other of the source and drain sections;
 a first barrier layer disposed between the oxide semiconductor layer and the first electrode and
 a second barrier layer disposed between the first barrier layer and the first electrode,
 wherein at least part of the first electrode does not overlap with the oxide semiconductor layer when viewed in the direction perpendicular to the major surface, wherein a first end portion of the first barrier layer and a first end portion of the second barrier layer are aligned with each other, wherein the first end portion of the first barrier layer and the second end portion of the second barrier layer physically and directly contact with the gate insulating layer; and wherein the first barrier layer directly contacts the oxide semiconductor layer.

2. The thin-film transistor of claim 1, further comprising a buffer layer formed over the substrate.

3. The thin-film transistor of claim 1, wherein the first barrier layer has a thickness of about 50 Å to about 500 Å.

4. The thin-film transistor of claim 1, wherein the first electrode is a source electrode and the second electrode is a drain electrode, wherein the source electrode and the drain electrode are formed of copper (Cu).

5. The thin-film transistor of claim 1, wherein the oxide semiconductor layer comprises zinc oxide (ZnO).

6. The thin-film transistor of claim 5, wherein the oxide semiconductor layer is doped with one or more ions selected from the group consisting of gallium (Ga), indium (In), stannum (Sn), zirconium (Zr), hafnium (Hf), cadmium (Cd), silver (Ag), Cu, germanium (Ge), gadolinium (Gd), Ti, and vanadium (V).

7. The thin-film transistor of claim 1, wherein each of the first barrier layer and the second barrier layer comprises an extending portion which does not overlap the oxide semiconductor layer when viewed in the direction and is disposed between the substrate and the first electrode.

8. The thin-film transistor of claim 1, further comprising an etch stop layer formed over the oxide semiconductor layer.

9. The thin-film transistor of claim 8, wherein the patterned etch stop layer partially exposes the oxide semiconductor layer.

10. A thin-film transistor comprising:
a substrate comprising a major surface;
a gate electrode formed over the substrate;
a gate insulating layer formed over the gate electrode and the substrate;
an oxide semiconductor layer formed over the gate insulating layer and comprising a source section and a drain section, wherein at least a portion of the oxide semiconductor layer overlaps the gate electrode when viewed in a direction perpendicular to the major surface;
a first electrode formed over the substrate and electrically connected to the source section;
a second electrode formed over the substrate and electrically connected to the drain section; and
a transparent barrier layer disposed between the oxide semiconductor layer and the first electrode, wherein at least part of the first electrode does not overlap with the oxide semiconductor layer when viewed in the direction perpendicular to the major surface, wherein a first end portion of the transparent barrier layer physically and directly contacts the gate insulating layer, and wherein the transparent barrier layer directly contact the oxide semiconductor layer.

11. The thin-film transistor of claim 10, further comprising a buffer layer formed over the substrate.

12. The thin-film transistor of claim 10, wherein the transparent barrier layer is formed of one or more materials selected from the group consisting of IZO, GZO, and CuMn.

13. The thin-film transistor of claim 10, wherein the transparent barrier layer has a thickness of about 50 Å to 500 Å.

14. The thin-film transistor of claim 10, wherein the first electrode is a source electrode and the second electrode is a drain electrode, wherein the source electrode and the drain electrode are formed of Cu.

15. The thin-film transistor of claim 10, wherein the oxide semiconductor layer comprises ZnO.

16. The thin-film transistor of claim 15, wherein the oxide semiconductor layer is doped with one or more ions selected from the group consisting of Ga, In, Sn, Zr, Hf, Cd, Ag, Cu, Ge, Gd, Ti, and V.

17. The thin-film transistor of claim 10, wherein the transparent barrier layer comprises an extending portion which does not overlap the oxide semiconductor layer when viewed in the direction and is disposed between the substrate and the first electrode.

18. The thin-film transistor of claim 10, further comprising an etch stop layer formed over the oxide semiconductor layer.

19. The thin-film transistor of claim 18, wherein the patterned etch stop layer partially exposes the oxide semiconductor layer.

20. A display device comprising:
the thin-film transistor of claim 1;
a patterned planarization layer formed over the thin-film transistor;
a first pixel electrode formed over the patterned planarization layer in each pixel;
a pixel defining layer formed over the planarization layer and the first pixel electrode in a region corresponding to the thin-film transistor;
a light-emitting layer formed over the first pixel electrode; and
a second pixel electrode formed over the light-emitting layer.

* * * * *